United States Patent
Hours et al.

(10) Patent No.: US 9,378,325 B2
(45) Date of Patent: Jun. 28, 2016

(54) METHOD AND APPARATUS FOR PERFORMING INTEGRATED CIRCUIT LAYOUT VERIFICATION

(75) Inventors: Xavier Hours, Tournefeuille (FR); Shitiz Arora, Noida (IN); Robert Scott Ruth, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 73 days.

(21) Appl. No.: 14/380,384

(22) PCT Filed: Feb. 23, 2012

(86) PCT No.: PCT/IB2012/000661
§ 371 (c)(1),
(2), (4) Date: Aug. 22, 2014

(87) PCT Pub. No.: WO2013/124703
PCT Pub. Date: Aug. 29, 2013

(65) Prior Publication Data
US 2014/0380258 A1  Dec. 25, 2014

(51) Int. Cl.
*G06F 17/50* (2006.01)
*H01L 21/027* (2006.01)

(52) U.S. Cl.
CPC .......... *G06F 17/5081* (2013.01); *H01L 21/027* (2013.01); *Y02T 10/82* (2013.01)

(58) Field of Classification Search
CPC .... G06F 17/5081; Y02T 10/82; H01L 21/027
See application file for complete search history.

(56) References Cited

U.S. PATENT DOCUMENTS

| | | | | |
|---|---|---|---|---|
| 5,298,773 A | * | 3/1994 | Woodruff | 257/204 |
| 5,796,638 A | * | 8/1998 | Kang et al. | 716/112 |
| 6,300,661 B1 | * | 10/2001 | Kadosh et al. | 257/371 |
| 6,303,444 B1 | * | 10/2001 | Burr | 438/289 |
| 6,493,850 B2 | * | 12/2002 | Venugopal et al. | 716/112 |
| 6,553,542 B2 | * | 4/2003 | Ramaswamy et al. | 716/112 |
| 6,782,516 B2 | * | 8/2004 | Rittman et al. | 716/52 |
| 6,834,380 B2 | * | 12/2004 | Khazei | 716/115 |
| 6,986,113 B2 | * | 1/2006 | Sinha et al. | 716/115 |
| 7,117,459 B2 | | 10/2006 | Tanimoto | |
| 7,243,317 B2 | * | 7/2007 | Wang et al. | 716/112 |
| 7,503,020 B2 | | 3/2009 | Allen et al. | |
| 7,617,464 B2 | | 11/2009 | Wang | |
| 7,853,909 B2 | * | 12/2010 | Kobayashi et al. | 716/106 |
| 7,873,928 B2 | * | 1/2011 | Lin et al. | 716/119 |
| 8,572,533 B2 | * | 10/2013 | Ferguson et al. | 716/112 |

(Continued)

OTHER PUBLICATIONS

Sinha et al.; "An Automated Tool for Detecting ESD Design Errors"; Electrical Overstress/Electrostatic Discharge Symposium Proceedings; Publication Year: 1998; pp. 208-217.*

(Continued)

*Primary Examiner* — Naum B Levin

(57) ABSTRACT

A method of performing layout verification for an integrated circuit (IC) layout is described. The method comprises receiving layout information for the IC layout, identifying at least one IC component within the IC layout, extracting localized layout information for the at least one IC component from the received layout information, defining the localized layout information for the at least one IC component within at least one component instance parameter therefor, and performing at least one layout verification check for the at least one component based at least partly on the at least one component instance parameter.

12 Claims, 3 Drawing Sheets

(56) References Cited

U.S. PATENT DOCUMENTS

2005/0229126 A1    10/2005  Wang et al.
2007/0245274 A1*   10/2007  Kimura .............................. 716/4
2013/0026576 A1*   1/2013   Stockinger .................... 257/355

OTHER PUBLICATIONS

Medea+: "21204: End-of-Life Investigations for Automotive Systems (ELIAS)", Project Profile, medeaplus.org, Apr. 2007-Mar. 2010, pp. 1-2.

Podgaynaya, Alevtina et al: "Enhancement of the Electrical Safe Operating Area of Integrated DMOS Transistors With Respect to High-Energy Short Duration Pulses", IEEE Transactions on Electron Devices, vol. 57, No. 11, Nov. 2010, pp. 3044-3049.

Sobe, Udo et al: "Robust Analog Design for Automotive Applications by Design Centering with Safe Operating Areas", 9th International Symposium on Quality Electronic Design, IEEE Computer Society, 2008, pp. 848-854.

International Search Report and Written Opinion correlating to PCT/IB2012/000661 dated Sep. 17, 2012.

* cited by examiner

METHOD AND APPARATUS FOR PERFORMING INTEGRATED CIRCUIT LAYOUT VERIFICATION

FIELD OF THE INVENTION

This invention relates to a method and apparatus for performing integrated circuit layout verification.

BACKGROUND OF THE INVENTION

Physical verification is the process of checking, using electronic design automation (EDA) software tools, whether an integrated circuit (IC) layout design meets certain criteria. IC layout is the representation of the IC in terms of planar geometric shapes which correspond to the patterns of metal, oxide and/or semiconductor layers that make up the components of the integrated circuit. Within the physical verification process, a layout generated for an IC is typically required to pass a series of checks. Such checks typically include design rule checking (DRC), layout versus schematic (LVS) checks, etc.

DRC is used to determine whether the physical layout of a particular IC layout satisfies a series of recommended parameters called design rules. The design rules are a series of parameters provided by a semiconductor manufacturer that enable the designer to verify the correctness of a mask set in terms of manufacturing process constraints, etc. As such, design rules are typically specific to a particular semiconductor manufacturing process. For example, a design rule set may specify certain geometric and connectivity restrictions to ensure sufficient margins to account for variability in semiconductor manufacturing processes. Examples of some basic design rules include a minimum width of any shape in the IC design, a minimum distance between two adjacent objects, etc.

DRC software usually takes as an input a file containing IC layout information, for example in the GDSII standard format, and a list of rules specific to the semiconductor manufacturing process. GDSII (Graphic Design System II) is a database file format which is the de facto industry standard for data exchange of integrated circuit or IC layout artwork. It is a binary file format representing planar geometric shapes, text labels, and other information about the layout in hierarchical form. The data can be used to reconstruct all or part of the artwork to be used in sharing layouts, transferring artwork between different tools, or creating photomasks. The DRC software then checks that the design rules have been complied with, and produces a report of design rule violations that the designer may or may not choose to correct. Such design rule checking does not validate the design, but checks that certain design rules intended to ensure a high overall yield and reliability for the design are complied with.

LVS is used to determine whether a particular IC layout corresponds to the original schematic or circuit diagram for the IC design. LVS checking typically involves three steps:
1. Extraction: the LVS software takes as an input a file containing IC layout information, for example in the GDSII standard format, and performs area based logic operations to identify IC components and connections within the IC layout;
2. Reduction: the LVS software combines the extracted components into series and parallel combinations, if possible, and generates a netlist representation of the IC layout ('layout netlist')—a similar reduction into series and parallel combinations is performed on the source schematic or circuit diagram netlist for the IC design;
3. Comparison: the LVS software then compares the layout netlist and (reduced) schematic/circuit diagram netlist to see if the two netlists 'match'.

Other verification checks may also be performed on an IC layout. For example, for power semiconductor devices, the Safe Operating Area (SOA) is defined as the voltage and current conditions over which the device can be expected to operate without self-damage. Accordingly, it is known to perform SOA reliability checks on IC layout designs for such devices whereby SOA rules may be implemented in a similar manner to the design rule set in order to ensure a high overall reliability for the design in relation to desired SOA conditions.

A problem with such conventional verification checks is that they do not take into consideration potential effects of the relative position of individual components and connections relative to one another, and other layout dependent factors. For example, using current physical and SOA verification techniques, design rules and SOA rules are currently limited to comparing measured values taken from the IC layout information with design and SOA rule values calculated using component specific parameters defined within schematic data for individual components and/or their respective device model, such as the length and width of a component's physical 'shape' within an IC layer, and/or general parameters applicable to the entire IC design, such as a minimum width of any shape in the IC design, a minimum distance between two adjacent objects, etc.

However, the performance of individual components is not solely dependent on such component specific parameters, which relate to individual components in isolation, and/or on overly generic parameters applicable to the entire IC layout. As a result, conventional design rules tend to be overly restrictive, often resulting in overly cautious designs of the IC layout, and thus in sub-optimal layout designs.

SUMMARY OF THE INVENTION

The present invention provides a method of performing layout verification for an integrated circuit (IC) layout, an apparatus and a non-transitory computer program product as described in the accompanying claims. Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
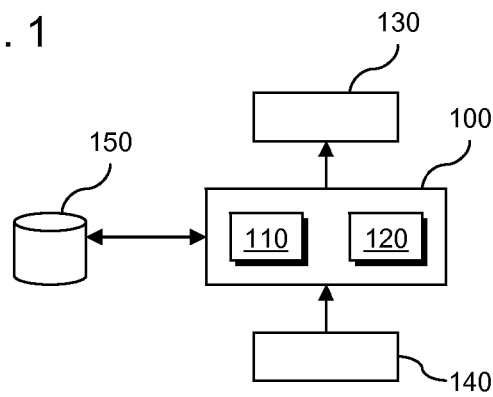
FIG. 1 illustrates a simplified block diagram of an example of an apparatus for performing verification of integrated circuit layouts.

Referring first to FIG. 1, there is illustrated a simplified block diagram of an example of an apparatus 100 for performing verification of integrated circuit layouts. Because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

In the illustrated example, the apparatus 100 comprises at least one signal processing module 110 arranged to perform the verification of integrated circuit layouts. For example, the signal processing module(s) 110 may be arranged to execute computer-readable code stored within one or more non-transitory computer program products, such as illustrated generally at 120, such computer-readable code being operable for performing the method of performing the verification of integrated circuit layouts.

As used herein, the expression non-transitory will be understood to refer to the non-ephemeral nature of the storage medium itself rather than to a notion of how long the stored information itself may persist in a stored state. Accordingly, memories that might otherwise be viewed, for example, as being volatile (such as many electronically-erasable programmable read-only memories (EPROM's) or random-access memories (RAM's)) are nevertheless to be viewed here as being 'non-transitory' whereas a signal carrier in transit is to be considered 'transitory' notwithstanding that the signal may remain in transit for a lengthy period of time. Accordingly, it is contemplated that such non-transitory computer program products 114 may comprise, by way of example only, at least one of a hard disk, a CD-ROM, an optical storage device, a magnetic storage device, a Read Only Memory, ROM, a Programmable Read Only Memory, PROM, an Erasable Programmable Read Only Memory EPROM, EPROM, an Electrically Erasable Programmable Read Only Memory, EEPROM, and a Flash memory.

In some examples, the apparatus 100 may be operably coupled to one or more user interface components, for example such as a display 130 and a keyboard 140. In this manner, a user is able to interact with computer programs executing on the signal processing module(s) 110 of the apparatus 100.

Figure 2:
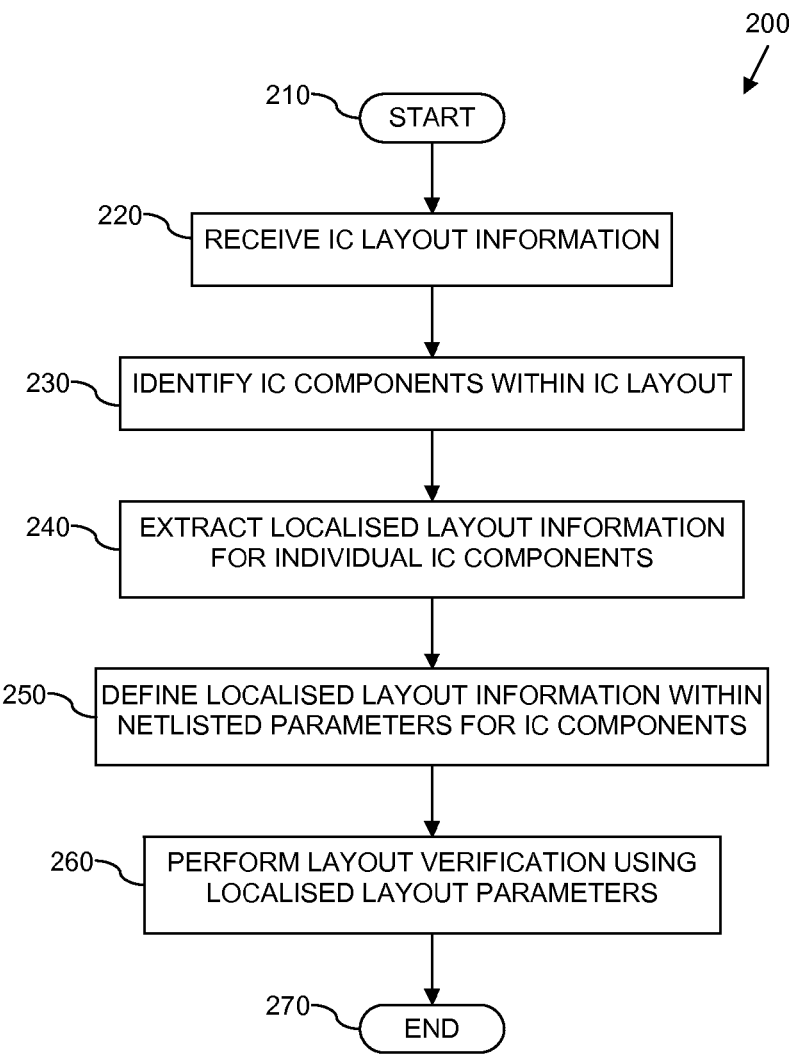
FIGS. 2 and 3 illustrate simplified flowcharts of an example of a method of performing layout verification for an integrated circuit (IC) layout.
Figure 3:
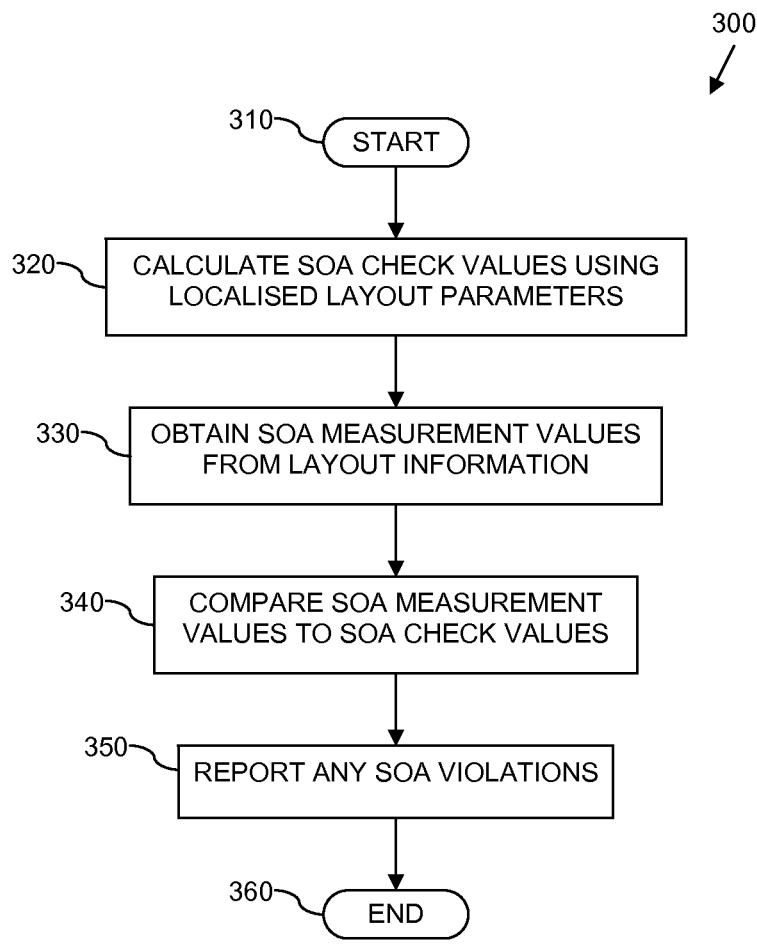

FIGS. 2 and 3 illustrate simplified flowcharts 200, 300 of an example of a method of performing layout verification for an integrated circuit, IC, layout, such as may be implemented within the apparatus 100 of FIG. 1. The method starts at 210, and moves on to 220 where layout information for the IC layout for which verification is to be performed is received. For example such IC layout information may be retrieved from a database, such as illustrated at 150 in FIG. 1. In some examples of the present invention, such IC layout information may comprise one or more files containing IC layout information, for example in the GDSII standard format.

Having received the IC layout information, the method moves on to 230 where IC components within the IC layout are identified. For example, IC components within the IC layout may be identified by way of performing area based logic operations to identify IC components and connections within the IC layout, such as conventionally performed as part of an extraction step of a layout versus schematic (LVS) procedure. Accordingly, in the example illustrated in FIG. 1, the signal processing module(s) 110 may be arranged to run the received IC layout information through various area based logic operations to determine the semiconductor components represented in the layout information by, for example, their layers of construction.

Localised layout information for individual IC components is then extracted from the received IC layout information, at 240. It is contemplated that such localised layout information may relate to substantially any factors within the IC layout that might have an effect on the functioning of the respective IC component.

Figure 4:
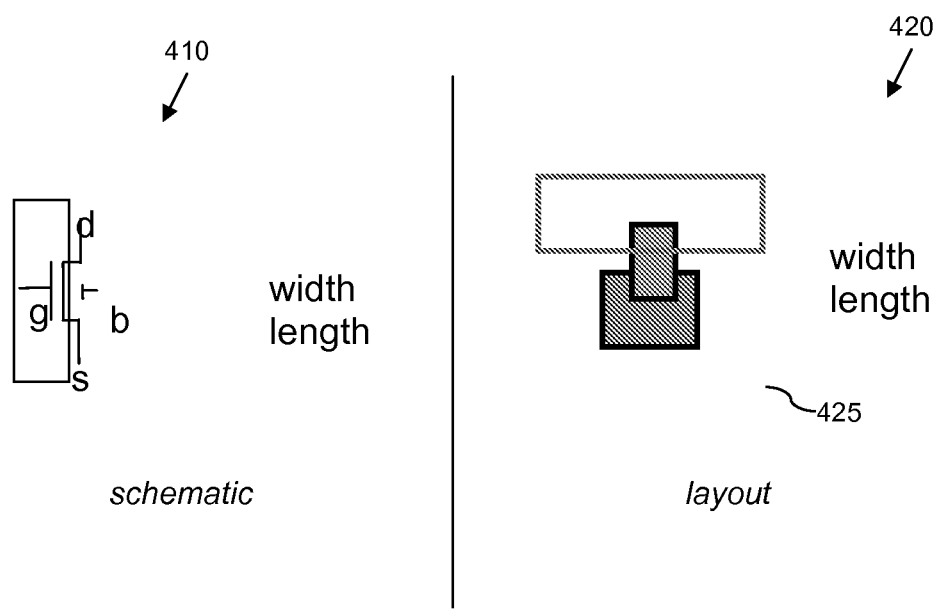
FIGS. 4 and 5 illustrate a schematic and layout representations of an IC component comprising.

For example, FIG. 4 illustrates a schematic representation 410 of an IC component comprising a MOS (metal oxide semiconductor) device, and a layout representation 420 of a gate terminal layer of the same MOS device. Conventional verification checks are currently limited to check values calculated using component specific parameters defined within schematic data for individual components and/or their respective device model, such as the length and width of a component's physical 'shape' within an IC layer, and/or general parameters applicable to the entire IC design, such as a minimum width of any shape in the IC design, a minimum distance between two adjacent objects, etc.

In contrast, localised layout information used within some examples of the present invention comprises information relating to the 'local' layout, illustrated generally at 425, for individual instances of IC components, such information being extracted from layout information.

For example, when creating an IC layout, a designer may add specific marking layers on top of real physical shapes. Accordingly, in some examples such localised layout information may comprise, say, an indication that the respective IC component is located within a designer marked area. In this manner, and as described in greater detail below, such localised layout information may be used to indicate that verification checks applied to IC components within such marked areas are to be modified in some way.

In some examples, such localised layout information may additionally/alternatively comprise, say, an indication that the respective IC component is located within an approved layout topology. For example, such an indication may be provided by way of a designer marked area, or may be automatically included within the layout information upon such approved layout topologies being included within the IC layout. In this manner, such localised layout information may be used to indicate that verification checks applied to IC components within such 'approved' areas are to be modified in some way, or in some cases even bypassed/disabled.

In some examples, such localised layout information may additionally/alternatively comprise one or more indications of a proximity of at least a part of the respective IC component to one or more objects of one or more predefined types. For example, the inventors have identified that the relative position of a guard ring around a MOS (metal oxide semiconductor) device can influence the threshold of the snapback effect for that device. Typically, the snapback effect occurs with higher voltages when the MOS device is closely surrounded by a guard ring, and smaller voltages when the guard ring is further away. Thus, in some examples, the localised layout information may comprise an indication of a proximity of the IC component to a guard ring therefor. In this manner, such localised layout information may be used, for example, to perform more accurate Safe Operating Area (SOA) checks relating to the snapback properties of the IC component, in the case of a MOS device.

The inventors have further identified that the proximity of a well tie, or strap, to an IC component, and in particular the proximity of a well tie to the gate terminal of a MOS device, may also influence the operation of that IC device in a similar manner to that of a guard ring. Thus, in some examples, the localised layout information may comprise an indication of a proximity of a gate terminal of the respective IC component to at least one well tie.

Having extracted the localised layout information for the IC components, the method moves on to 250, where the localised layout information is defined within one or more component instance parameters, for example within one or more netlisted parameters for the IC layout. In some examples, the steps of identifying IC components within the IC layout and extracting localised layout information therefor may be performed as part of a layout versus schematic (LVS) verification procedure. As such, the localised layout information may be defined within one or more parameters within a layout netlist for the IC layout generated during the LVS verification procedure.

Thus, in this manner, localised layout information for IC components within an IC layout is extracted from the layout information and defined within netlisted parameters. Layout verification may subsequently be performed using such localised layout parameters, as indicated at 260 in FIG. 2, enabling more accurate verification to be achieved based on actual IC layout implementations. In particular, by enabling such localised layout parameters to be available during layout verification checks, for example during physical verification and/or SOA verification and the like, the rules applied during such verification checks may be adapted in accordance with specific layout topologies in order to more accurately verify the performance and reliability etc. of such layout topologies. As a result, less restrictive design rules, SOA rules, etc. may be implemented, enabling more efficient layout designs to be achieved.

Figure 5:
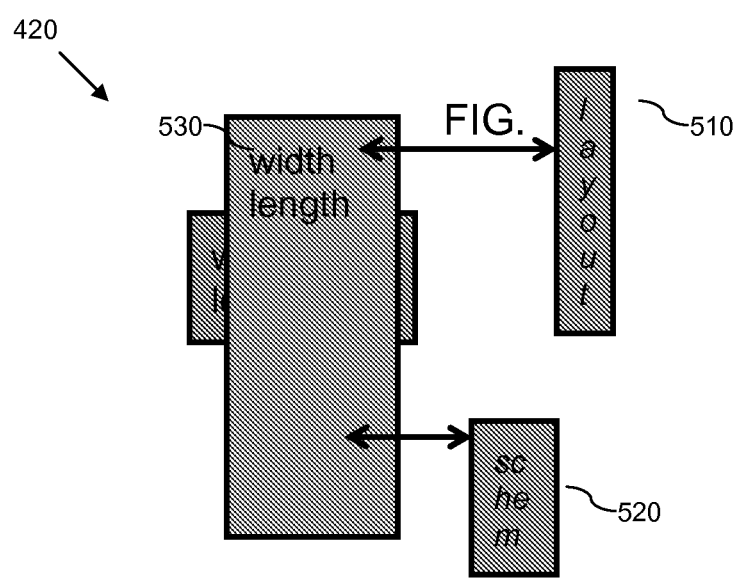

FIG. 5 illustrates a simplified example of extracting localised layout information for the MOS device of FIG. 4. In particular, FIG. 5 illustrates a simplified view of the gate terminal layer 420 of the MOS device. FIG. 5 also illustrates a first well tie 510 and a second well tie 520 within the vicinity of the gate terminal 530 of the MOS device. In some examples, the extraction of localised layout information may comprise identifying spacing between the gate terminal 420 of the MOS device and well ties less than a certain distance from the gate terminal 420, for example that are less than 20 μm from the gate terminal. The localised layout information may then be defined within an instance parameter (e.g. 'tProx') for the MOS device in terms of, say, the distance between the gate terminal 530 of the MOS device and the closest well tie, which in the illustrated example comprises the distance between the gate terminal 530 of the MOS device and the second well tie 520. This instance parameter 'tProx' may then be included as a netlisted parameter within, for example, a layout netlist for the IC layout.

Referring now to FIG. 3, there is illustrated an example of performing layout verification using the localised layout parameters, such as may be performed at 260 in FIG. 2. In the illustrated example, this part of the method comprises performing SOA verification, and starts at 310. SOA check values are calculated for individual IC components within the IC layout at 320 using the parameters within which the localised layout information has previously been defined. Such check values may be calculated using any appropriate equation, and in particular may be calculated using any appropriate equation linking layout effect as defined within the localised layout parameters and, in this example, an SOA threshold. Such SOA values may also be calculated using other parameters, for example component specific parameters defined within schematic data for individual components and/or their respective device model, such as the length and width of a component's physical 'shape' within an IC layer, and/or general parameters applicable to the entire IC design, such as a minimum width of any shape in the IC design, a minimum distance between two adjacent objects, etc. In some examples, such localised layout parameters and schematic parameters may be specified within one or more netlists for the IC layout. For example, the netlisted localised layout parameters may be propagated to netlists for post layout electronic design automation modules in order enable post layout verification checks to take into account such localised layout parameters.

Having calculated the SOA check values, the method moves on to 330 where SOA measurement values are obtained for individual IC components from the layout information. These measurement values may then be compared to respective SOA check values using electrical simulations, at 340 to determine whether SOA conditions have been met within the IC layout. For example, an SOA condition may require the measured value to be above and/or below one or more calculated check values, (not) between certain calculated check values, etc. SOA violations are then reported, at 350, that the designer may or may not choose to correct. For example, the designer may choose to change to layout or additionally/alternatively to alter the overall electrical signal to the respective IC component (for example by altering the schematic for the IC device to, say, connect a pull down on the signal so that an overshoot could be smaller). The method then ends at 360.

In this manner, layout verification, such as SOA verification in the illustrated example, may be performed using check values calculated based at least partly on localised layout parameters, enabling more accurate rule verification to be achieved based on actual IC layout implementations. In particular, by enabling such localised layout parameters to be available during layout verification checks, for example during SOA verification in the illustrated example, the rules applied during such verification checks may be adapted in accordance with specific layout topologies in order to more accurately verify the reliability etc. of such layout topologies. As a result, less restrictive design rules may be implemented, enabling more efficient layout designs to be achieved.

For example, the localised layout parameter for one or more IC components may comprise, say, an indication that the respective IC component is located within a designer marked area. In this manner the calculation of one or more verification check values for IC components within such marked areas may be modified in some way, for example by increasing/decreasing the check value by, say, 20%, or by modifying some other value used in calculating the check value. Additionally/alternatively, in some examples the localised layout parameter for one or more IC components may comprise, say, an indication that the respective IC component is located within an approved layout topology. In this manner the calculation of one or more verification check values for IC components within such an approved layout topology may be modified in some way, or in some cases even bypassed/disabled. Additionally/alternatively, in some examples the localised layout parameter for one or more IC components may comprise, say, an indication of a proximity of at least a part of the respective IC component to one or more objects of one or more predefined types. For example, the localised layout information may comprise an indication of a proximity of the IC component to a guard ring therefor, or an indication of a proximity of a gate terminal of the IC component to at least one well tie. In this manner, such localised layout information may be used, for example, to modify SOA check values relating to the snapback properties of the IC component.

At least parts of the invention may be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions hereof, may implemented as soft or code representations of physical circuitry or of logical representations convertible into physical circuitry, such as in a hardware description language of any appropriate type.

Also, the invention may be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A computer system executed method of performing layout verification for an integrated circuit (IC) layout; the method comprising:
   receiving layout information for the IC layout;
   identifying at least one IC component within the IC layout;
   extracting localised layout information for the at least one IC component from the received layout information, wherein the localised layout information comprises an indication that the at least one IC component is located within a designer marked area;
   defining the localised layout information for the at least one IC component within at least one IC component instance parameter therefor; and performing at least one layout verification check for the at least one IC component within the designer marked area based at least partly on the at least one IC component instance parameter to verify a mask set for the IC that would be manufactured in a semiconductor manufacturing process based on the verified mask set, wherein the performing the at least one layout verification check utilizes at least one layout verification check value that is modified by increasing the at least one layout verification check value by a percentage value.

2. The method of claim 1, wherein the localised layout information comprises one or more of:
an indication that the at least one IC component is located within an approved layout topology;
an indication of a proximity of at least a part of the at least one IC component to an object of a predefined type.

3. The method of claim 2, wherein the localised layout information comprises an indication of a proximity of the at least one IC component to a guard ring therefor.

4. The method of claim 2, wherein the localised layout information comprises an indication of a proximity of a gate terminal of the at least one IC component to at least one well tie.

5. The method of claim 1, wherein the method comprises defining the localised layout information for the at least one IC component within at least one netlisted parameter for the IC layout.

6. The method of claim 5, wherein the method comprises defining the localised layout information for the at least one IC component within at least one netlisted parameter within a layout netlist for the IC layout.

7. The method of claim 6, wherein the method further comprises propagating the netlisted localised layout parameters to netlists for post layout electronic design automation modules.

8. The method of claim 1, wherein the method comprises identifying at least one IC component within the IC layout and extracting localised layout information for the at least one IC component from the received layout information as part of a layout versus schematic (LVS) verification procedure.

9. The method of claim 1, wherein the method comprises performing at least one safe operating area (SOA) verification check for the at least one IC component based at least partly on the at least one IC component instance parameter.

10. The method of claim 1, wherein the performing the at least one layout verification check for the at least one IC component within the designer marked area is disabled.

11. An apparatus to perform layout verification for an integrated circuit (IC) layout comprising at least one signal processing module that is configured to:
receive layout information for an Integrated Circuit (IC) layout;
identify at least one IC component within the IC layout;
extract localised layout information for the at least one IC component from the received layout information, wherein the localised layout information comprises an indication that the at least one IC component is located within a designer marked area;
define the localised layout information for the at least one IC component within at least one IC component instance parameter therefor; and
perform at least one layout verification check for the at least one IC component within the designer marked area based at least partly on the at least one IC component instance parameter to verify a mask set for the IC that would be manufactured in a semiconductor manufacturing process based on the verified mask set, wherein the perform the at least one layout verification check utilizes at least one layout verification check value that is modified by increasing the at least one layout verification check value by a percentage value.

12. The apparatus of claim 11, wherein the perform the at least one layout verification check for the at least one IC component within the designer marked area is disabled.

* * * * *